United States Patent [19]
Grundy

[11] 4,034,365
[45] July 5, 1977

[54] MOST RESTRICTIVE DIGITAL TO ANALOG CONVERTER

[75] Inventor: Reed H. Grundy, Murrysville, Pa.

[73] Assignee: Westinghouse Air Brake Company, Swissvale, Pa.

[22] Filed: May 27, 1975

[21] Appl. No.: 581,222

[52] U.S. Cl. .......................... 340/347 DA; 307/357
[51] Int. Cl.² ........................................ H03K 13/00
[58] Field of Search ......... 340/347 DA; 307/235 F, 307/235 G, 204, 219; 328/115, 137, 146, 147

[56] References Cited

UNITED STATES PATENTS

| 3,096,446 | 7/1963 | Cohen | 307/235 G |
| 3,355,670 | 11/1967 | Pastoriza | 340/347 DA |
| 3,540,037 | 11/1970 | Ottesen | 340/347 DA |
| 3,714,465 | 1/1973 | Skrenes | 307/235 G |
| 3,740,652 | 6/1973 | Burgener | 307/235 G |

Primary Examiner—Charles D. Miller
Attorney, Agent, or Firm—J. B. Sotak; R. W. McIntire, Jr.

[57] ABSTRACT

This disclosure relates to an electronic converter circuit for a cab signal system employing a negative feedback type of operational amplifier and two banks of resistive and diode elements. One bank of resistive and diode elements electrically couples the respective contacts of a master control handle through current limiting resistors and clamping diodes to the inverting input of the operational amplifier while the other bank of resistive and diode elements also electrically couples the respective outputs of a relay logic decoder through the current-limiting resistors and clamping diodes to the inverting input of the operational amplifier so that the operational amplifier produces an output signal which is indicative of the most restrictive speed condition of either the master control handle or the relay logic decoder.

4 Claims, 1 Drawing Figure

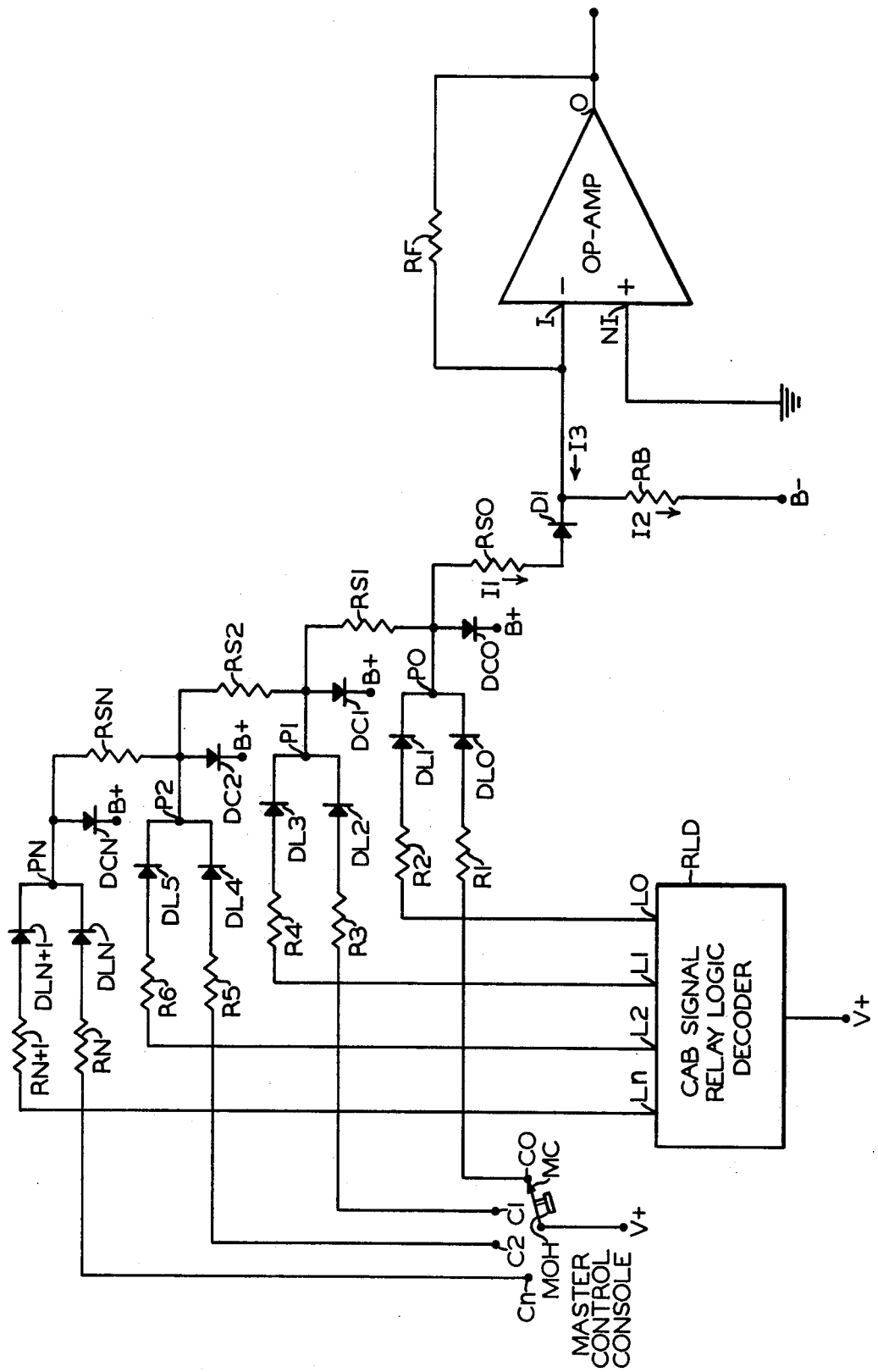

MOST RESTRICTIVE DIGITAL TO ANALOG CONVERTER

SUBJECT OF THE INVENTION

This invention relates to a most restrictive digital to analog converter and, more particularly, to an electronic vehicle speed signal circuit arrangement for producing an analog voltage which is determined by the most restrictive condition of either the manual position of the master control handle or the electrical state of the relay logic decoding unit of the cab signal equipment.

BACKGROUND OF THE INVENTION

In certain control systems, such as in speed regulation apparatus for mass and/or rapid transit operations, it is common practice to convey the various speed commands to the vehicle or train via cab signaling. Normally, the cab signal command signals take the form of coded carrier waveform wherein the code rate determines the given permissible speed or velocity that the vehicle or train is to travel within the particular block or track section. The coded or modulated speed command signals are inductively coupled from the wayside or track rails to the vehicle through suitable magnetic pickup devices. The picked-up modulated carrier signals are amplified, demodulated, shaped, limited and are then applied to an appropriate decoder, such as a relay decoding logic unit. In a semiautomatic cab signaling system, a trainman or engineer manually operates a master control handle to either increase or decrease the speed of the vehicle and train preferably in accordance with the received cab signal speed commands of the given block or track section along the route of travel. In keeping with the operating standards, it is necessary to compare the digital contact position of the operating handle with the digital output of the cab signal relay logic network in order to ensure that the vehicle is traveling at the most restrictive speed. That is, when a disagreement occurs between the speed position of the contact handle and the speed command of the relay logic decoder, it is a basic requirement that the vehicle operate at the lesser of the two speeds in order to maintain a high degree of safety. In addition to determining the most restrictive of the two speeds, the digital inputs must be converted to an analog signal for subsequent use by the cab signal control equipment for effectively regulating the speed of the vehicle or train of the mass and/or rapid transit system.

OBJECTS OF THE INVENTION

Accordingly, it is an object of this invention to provide a novel most restrictive digital to analog converter.

A further object of this invention is to provide an electronic converting circuit for producing an analog output which is proportional to the most restrictive of a pair of digital inputs.

Another object of this invention is to provide an electronic digital to analog converter employing an operational amplifier and two banks of impedance elements coupled to the master control handle and the relay logic network of a cab signal system.

Still a further object of this invention is to provide a unique digital to analog converting circuit arrangement for converting the most restrictive of two digital inputs to an analog output.

Still another object of this invention is to provide a most restrictive digital to analog converter for speed regulating apparatus of a cab signal system.

Yet a further object of this invention is to provide an electronic most restrictive digital to analog converter for producing an analog output voltage which is determined by the most restrictive condition of either the manual position of a master control handle or the electrical state of relay logic decoder of the cab signal apparatus.

Yet another object of this invention is to provide a most restrictive digital to analog converter having a first input means, a second input means, a degenerative operational amplifier including an inverting and noninverting input and an output, a selected one of a plurality of first resistive means resistively coupling the first input means to at least one of the inverting and noninverting inputs of the degenerative operational amplifier, and a selected one of a plurality of second resistive means resistively coupling said second input means to at least one of the inverting and noninverting inputs of the degenerative operational amplifier wherein the amplitude of a signal developed on the output of the degenerative operational amplifier is representative of which one of the selected ones of the plurality of the first and second resistive means is the most restrictive.

An additional object of this invention is to provide a new and improved most restrictive digital to analog converter which is economical in cost, simple in design, reliable in operation, durable in use, and efficient in service.

SUMMARY OF THE INVENTION

In accordance with the present invention, the most restrictive digital to analog converter includes an integrated circuit operational amplifier having an inverting and noninverting input and an output. A feedback resistor is coupled from the output to the inverting input while the noninverting input is directly connected to ground. The inverting input is connected to a negative voltage supply by a biasing resistor and is also connected to a series of current-limiting resistors via a diode. Each of the series current-limited resistors is connected to a separate one of a first bank of series resistors and diodes and also to a separate one of a second bank of series resistors and diodes. A separate clamping diode is connected between each current-limiting resistor and the common point of the separate ones of the series resistors and diodes of the first and second banks. Each of the series resistor and diode of the first bank is connected to a respective electrical contract of a manual master speed control, and each of the series resistor and diode of the second bank is connected to the respective output terminal of a speed command relay logic decoding unit so that the output of the operational amplifier is determined by the most restrictive speed condition of either the master control handle or the relay logic decoding unit.

BRIEF DESCRIPTION OF THE DRAWING

The foregoing objects and other attendant features and advantages of the subject invention will be more fully evident and more readily appreciated from the following detailed description when considered in conjunction with the accompanying drawing wherein:

The single FIGURE is a schematic circuit diagram illustrating a preferred embodiment of the electronic most restrictive digital to analog converter embodying the principles of the present invention.

DESCRIPTION OF THE PREFERRED EMBODIMENT

Referring to the single FIGURE of the drawing, there is shown a preferred embodiment of the most restrictive digital to analog converting circuit arrangement for use in a cab signal system for mass and/or rapid transit operations. As previously mentioned in the cab signal operation, the speed of the transit vehicle or train is normally regulated by a trainman or engineer who is instructed by the speed command signals picked up from the wayside. The picked-up coded cab signal establishes the maximum velocity or speed that the train may travel in a given block or track section so that the trainman may manipulate the master control handle in accordance therewith. However, it is essential for the purpose of safety to prevent the master control from increasing the maximum speed set by the cab signal, but it is necessary to allow the operator to modify and decrease the speed of the train to any level below the set maximum speed command. As shown, the operator may selectively manipulate the manual operating handle MOH on the master control console which is conveniently located within his easy reach. A movable contactor MC is connected to the handle MOH and is selectively moved to engage one of a plurality of fixed or stationary contacts C0, C1, C2, Cn which represent the various speeds that the trainman may desire to operate the train. For example, the contact C0 may represent a zero (0) speed, while the contacts C1, C2 and Cn may correspond to 15 mph, 30 mph, and n mph, respectively. However, it will be understood that a greater or lesser number of contacts and representative speeds may be employed in practicing the present invention. As shown, the movable contact MC is connected to the positive input terminal V− of a suitable d.c. voltage supply (not shown).

As previously mentioned, coded cab signals are picked up from the track rails by inductive pick-up devices or means and are demodulated, amplified, shaped, limited and decoded by the car-carried cab signal equipment. The cab signal equipment includes a relay logic decoder or decoding unit RLD. The decoding unit RLD includes a plurality of electromagnetic decoding relays which are energized or deenergized in accordance with the code rate or frequency of the various received coded cab signals. Thus, the front contacts of the respective relays are either opened or closed in accordance with the electrical condition of its associated electromagnetic relay. That is, the energized and deenergized conditions of the decoding relays of the decoder RLD function to establish a circuit path from the positive input voltage terminal V+ to only one of the leads or conductors L0, L1, L2, or Ln. It will be appreciated that a greater or lesser number leads and associated decoding relays may be employed depending upon the number of speed commands used in any given cab signaling system.

It will be seen that the stationary contacts C0, C1, C2, and Cn are connected to a first bank or set of resistive and diode means, while the leads L0, L1, L2, and Ln are connected to a second bank or set of resistive and diode means. As shown, the first bank includes a plurality of series-connected resistors R1, R3, R5, and RN and associated diodes DL0, DL2, DL4, and DLN, respectively, while the second bank includes a plurality of series-connected resistors R2, R4, R6, and RN+1 and associated diodes DL1, DL3, DL5, and DLN+1, respectively. Thus, the zero speed stationary contact C0 is connected to one end of resistor R1, while the zero speed command lead L0 is connected to one end of resistor R2. The other end of resistor R1 is connected to the anode electrode of diode DL0, while the other end of resistor R2 is connected to the anode electrode of diode DL1, and the cathode electrodes of diodes DL0 and DL1 are commonly connected to point P0. The 15 mph contact C1 is connected to resistor R3 which in turn is connected to diode DL2, the cathode of which is connected to point P1. Likewise, the 15 mph speed command lead L1 is connected to resistor R4 which in turn is connected to diode DL3, the cathode of which is connected to the common point P1. The 30 mph contact C2 and the 30 mph speed command lead L2 are connected to common point P2 via resistor R5 and diode DL4 and resistor R6 and diode DL5, respectively. Likewise, the n mph manual contact Cn and the n mph speed command lead Ln are connected to the common point Pn through series resistor-diode RN-DLN and series resistor-diode RN+1–DLN+1, respectively. The common point P0 is connected to a positive voltage terminal B+ of a suitable d.c. supply voltage (not shown) via clamping diode DC0. Similarly, the common point P1 is connected to the positive voltage terminal B+ via clamping diode DC1. Likewise, the common points P2 and PN are connected to the positive voltage terminal B+ via clamping diodes DC2 and DCN, respectively. A series of current-limiting resistors RS0, RS1, RS2, and RSN are coupled through a diode D1 to one of the inputs of an integrated circuit operational amplifier OP-AMP. As shown, the operational amplifier OP-AMP has a pair of inputs I and NI and a single output 0. The operational amplifier may be of the type manufactured and sold by Fairchild Semiconductor Corporation of Mountainview, California, and designated as an A-741. The input I is termed the negative (−) or inverting input, while the input NI is termed the positive (+) or noninverting input. As shown, the inverting input is connected to the cathode electrode of diode D1, while its anode electrode is connected to resistor RS0. The inverting input I is also connected by resistor RB to a negative voltage terminal B− of a suitable d.c. supply voltage (not shown). In practice, the absolute value of the B− voltage is equal the absolute value of the B+ voltage, the purpose of which will be described hereinafter. The noninverting input NI is directly connected to ground. It will be noted a negative feedback path is completed from output to the input inverting input I by the feedback resistor RF. Thus, the operation of amplifier OP-AMP is a negative feedback inverting type of amplifying circuit. In practice, the output terminal 0 of the operational amplifier OP-AMP is coupled and provides the desired analog velocity signal for the summing network of the velocity brake error circuit board or propulsion, braking, and station stopping circuit of the cab signaling system. The diodes DL0, DL1, DL2, DL3, etc. provide isolation between the contacts of the master control and the leads of the logic decoder since they prevent the flow of reverse current through the circuits.

DESCRIPTION OF THE OPERATION

In describing the operation, it will be assumed all the circuit components and elements are intact and that the digital to analog converter and the entire cab signaling system is operating properly. Further, let us assume that the value of d.c. voltage applied to terminals V+ are slightly larger than the d.c. voltage level applied to the B+ terminals, the purpose of which will become apparent presently. In addition, let us assume that a zero speed command is in force so that the decoding unit RLD is effective in establishing a circuit path from the V+ terminal to lead L0, and that the engineer has the handle of the master control in a position wherein the movable contact MC engages and applies the V+ voltage to stationary contact C0. Under this assumed condition, it will be seen that the diode DL0 is forwardly biased by the V+ voltage applied to contact C0, and that the diode DL1 is also forwardly biased by the V+ voltage appearing on lead L0. Thus, the conduction of diodes DL0 and DL1 causes the point P0 to be clamped to a B+ voltage plus the voltage drop of diode DC0. It will be appreciated that the diode D1 removes the diode voltage drop that would normally appear across resistor RS0. Hence, a current $I_1$ having a value equal to B+/RS0 flows through resistor RS0. In practice, the value of the resistor RB is chosen to be the same as the value of resistor RS0. Hence, a current $I_2$ having a value equal to B−/RB flows through the resistor RB. Since the sum of the current entering a junction point is equal to the current leaving a junction, it will be appreciated that $I_1 + I_3 = I_2$, or $I_3 = I_2 - I_1$. Thus, the currents $I_1$ and $I_2$ are equal since the resistors RS0 and RB and the absolute values of voltages B+ and B− are equal. Accordingly, the current $I_3$ is zero, and since operational amplifier OP-AMP is connected in a negative feedback mode of operation, it will be appreciated that the output voltage on terminal 0 is equal to $I_3$ RF. In other words, the output voltage on terminal 0 of the operational amplifier is zero volts when a zero mph speed command signal is received on board and when the master control contact MC is engaging the zero mph contact C0.

Let us now assume that the vehicle is ready to leave a station and that an initial 15 mph speed command is received on board so that a positive V° voltage is developed on lead L1 by the relay logic decoder RLD. Further, let us assume that the motorman or engineer has not yet taken any action so that the movable contact still engages stationary contact C0. It will be appreciated that the diode DL0 remains conductive due to the forward biasing by the V+ voltage applied to contact C0 so that point P0 remains clamped by diode DC0. With the V+ voltage now appearing on lead L1, the diode DL3 is forwardly biased so that the point P1 is clamped to the B+ voltage plus the voltage drop of a diode. However, it will be seen that junction points P0 and P1 are at the same voltage level so that no current flows through resistor RS1. Hence, the most restrictive condition prevails, and the output terminal 0 of operational amplifier OP-AMP remains at zero (0) volts even though a 15 mph speed command signal appears on lead L1.

Let us now assume that the motorman moves the operating handle MOH to a position in which movable contact engages stationary contact C2 so that a 30 mph speed is requested and that a 15 mph speed command signal is being received on board so that the V+ voltage remains on lead L1. Under this condition, the diode DL4 is forwardly biased and conducts so that the junction point P2 is clamped to the B+ voltage plus the diode voltage drop. However, no current flows through resistor RS2 since junction point P1 is the same voltage level as junction point P1. However, the diode DL3 is conducting and the junction point P1 is clamped to the diode DC1 so that current now flows through resistor RS1 as well as resistor RS0. Since the total resistance increases, i.e., RS0 + RS1, the amount of current $I_1$ proportionally decreases so that current $I_3$ is no longer zero but is some positive value. Hence, the output signal $I_3$RF at the terminal 0 is a positive voltage having a value which is proportional to the 15 mph speed command, such a 1.5 volts. In practice, the parameters of the circuit are scaled such as to provide one tenth (0.1) of a volt per mile per hour. Hence, again the analog signal appearing on output terminal 0 is the most restrictive of the two digital input signals even though the motorman inadvertently establishes a speed request in excess of the picked-up speed command signal. Conversely, if the speed command signal is in excess of the speed request handle position, the most restrictive, namely, the request signal, will prevail. It will be appreciated that the values of the resistors RS2 and RSN may be selectively chosen to cause an output voltage developed on terminal 0 to be directly proportional to the desired rate or mph.

As previously mentioned, while four distinct speeds have been described, it will be understood that a greater or lesser number of speeds may be readily accommodated by the presently described invention. It will be appreciated that while the present invention finds particular utility in cab signaling equipment, it is understood that the invention may be employed in other apparatus and equipment which have need for such operation. In addition, it is readily evident that the presently described most restrictive digital to analog converter may be employed in other various systems and networks which require the unique operation present in this invention.

Additionally, it will be understood that various changes, modifications, and alterations may be employed without departing from the spirit and scope of this invention. Thus, it will be appreciated that the showing and description of the present invention should be taken in an illustrative or diagrammatic sense only.

Having now described the invention what I claim as new and desire to secure by Letters Patent, is:

1. A most restrictive digital to analog converter comprising, an integrated circuit operational amplifier having a first and a second input signal and an output, a degenerative feedback path coupled between said output and said first input, said second input coupled to a reference potential, said first input is also connected to a source of biasing voltage and is coupled to a series of current-limiting resistors by series diode, each of said series current-limiting resistors connected to a separate one of a first bank of series resistors and diodes and also connected to a separate one of a second bank of series resistors and diodes, a separate clamping diode connected between each one of said current-limiting resistors and the common point of said separate ones of said series resistors and diodes of said first and said second banks, each of said series resistors and diodes of said first bank selectively connected to a first digital input means, and each of said series of resistors and diodes of said second bank selectively connected to a second digital input means so that said integrated circuit operational amplifier produces an output signal in accordance with which one of the first or second digital input means is the most restrictive.

2. The most restrictive digital to analog converter as defined in claim 11, wherein said first input means includes a switching mechanism and a d.c. voltage source.

3. The most restrictive digital to analog converter as defined in claim 11, wherein said second input means includes a relay logic network and a d.c. voltage source.

4. The most restrictive digital to analog converter as defined in claim 11, wherein said integrated circuit operational amplifier is an inverting amplifier.

* * * * *

UNITED STATES PATENT AND TRADEMARK OFFICE
CERTIFICATE OF CORRECTION

PATENT NO. : 4,034,365
DATED : July 5, 1977
INVENTOR(S) : Reed H. Grundy

It is certified that error appears in the above–identified patent and that said Letters Patent are hereby corrected as shown below:

Column 7, line 4, "11" should be --1--

Column 8, line 1, "11" should be --1-- line 5, "11" should be --1--

Signed and Sealed this

Thirteenth Day of December 1977

[SEAL]

Attest:

RUTH C. MASON
Attesting Officer

LUTRELLE F. PARKER
Acting Commissioner of Patents and Trademarks